(12) United States Patent
Appelt et al.

(10) Patent No.: US 6,300,575 B1
(45) Date of Patent: *Oct. 9, 2001

(54) CONDUCTOR INTERCONNECT WITH DENDRITES THROUGH FILM

(75) Inventors: Bernd K. Appelt, Apalachin; Saswati Datta, Binghamton; Michael A. Gaynes, Vestal; John M. Lauffer, Waverly; James R. Wilcox, Vestal, all of NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/918,084

(22) Filed: Aug. 25, 1997

(51) Int. Cl.[7] .................................................. H05K 1/14
(52) U.S. Cl. ........................... 174/256; 174/254; 174/255; 174/259; 174/261; 439/60
(58) Field of Search .................................. 174/250, 254, 174/255, 258, 259, 261, 256; 361/748, 784, 790, 792, 795, 771, 776, 779, 803; 439/66, 91, 591; 257/734, 739, 779, 780

(56) References Cited

U.S. PATENT DOCUMENTS

| 3,359,145 | 12/1967 | Salyer ........................... 156/1 |
| 3,795,047 | * 3/1974 | Abolafia et al. .................. 174/259 X |
| 4,157,932 | 6/1979 | Hirata ................................ 156/310 |
| 5,019,944 | 5/1991 | Ishii et al. ......................... 361/783 |
| 5,137,461 | 8/1992 | Bindra et al. ........................... 439/74 |
| 5,298,685 | 3/1994 | Bindra et al. ......................... 174/250 |
| 5,435,057 | 7/1995 | Bindra et al. ............................ 29/830 |
| 5,509,200 | 4/1996 | Frankeny et al. ...................... 29/852 |
| 5,562,971 | * 10/1996 | Tsuru et al. ....................... 174/255 X |
| 5,736,681 | * 4/1998 | Yamamoto et al. ................. 174/265 |
| 5,939,786 | * 11/1999 | Downes, Jr. et al. ............... 257/739 |
| 5,977,642 | * 11/1999 | Appelt et al. ........................ 257/780 |

FOREIGN PATENT DOCUMENTS 1 568 464    2/1978  (GB) .

OTHER PUBLICATIONS

"Direct Chip Bonding Using Transferred Conductive Adhesive Film," *IBM Technical Disclosure Bulletin*, vol. 32, No. 10B, pp. 474–475, Mar. 1990.

* cited by examiner

*Primary Examiner*—Albert W. Paladini
(74) *Attorney, Agent, or Firm*—James A. Lucas; Driggs, Lucas, Brubaker & Hogg Co., LPA

(57) ABSTRACT

A method is provided for connecting two conductive layers in an electronic circuit package comprising the steps of forming dendrites on selected regions of a first conductive layer, forming dendrites on selected regions of a second conductive layer, applying an epoxy adhesive material over the first conductive layer, and compressively attaching the second conductive layer to the first conductive layer such that the dendrites on the first conductive layer contact the dendrites on the second conductive layer. Also claimed is an electronic circuit package incorporating the dendrites used for electrical interconnection manufactured in accordance with the present invention. An alternative embodiment of the invention utilizes an intermediate surface metal with dendrites in place of a "through via."

13 Claims, 2 Drawing Sheets

CONDUCTOR INTERCONNECT WITH DENDRITES THROUGH FILM

TECHNICAL FIELD OF THE INVENTION

The present invention relates to electronic circuit packages with dendrites connecting two conductive surfaces through a film and method for producing same. The dendrites electrically connect the two conductive surfaces and avoid the need for drilling or punching holes for vias or through-holes.

BACKGROUND OF THE INVENTION

Electronic circuits contain many (sometimes millions) of components such as resistors, capacitors, inductors, diodes, electromechanical switches, and transistors. High density packaging of electronic components is particularly important to allow fast access to large amounts of data in computers. High density electronic circuit packages also are important in high frequency devices and communications devices. The components are connected to form circuits and circuits are connected to form functioning devices. The connections perform power and signal distribution. In a multi-layer electronic circuit package, some layers of the package serve as power planes and other layers serve as signal planes, depending on the operational requirements of the device. The devices require mechanical support and structural protection. The circuits themselves require electrical energy to function. The functioning devices, however, produce heat, or thermal energy which must be dissipated so that the devices do not stop functioning. Moreover, while high density packaging of a number of components can improve performance of the device, the heat produced by the power-consuming components can be such that performance and reliability of the devices is adversely impacted. The adverse impact arises from electrical problems such as increased resistivity and mechanical problems such as thermal stress caused by increased heat.

Electronic circuit packages, such as chips, modules, circuit cards, circuit boards, and combinations of these, thus must meet a number of requirements for optimum performance. The package must be structurally sturdy enough to support and protect the components and the wiring. In addition, the package must be capable of dissipating heat and must have a coefficient of thermal expansion that is compatible with that of the components. Finally, to be commercially useful, the package should be inexpensive to produce and easy to manufacture.

High density packages necessarily involve increased wiring density and thinner dielectric coatings between layers in a multi-layer electronic circuit package. The layers in a multi-layer package typically are electrically connected by vias and through-holes. The term "via" is used for a conductive pathway between adjacent layers in a multi-layer electronic circuit package. The term "through-hole" is used for a conductive pathway that extends to a non-adjacent layer. For high density packages the through-holes are increasingly narrow in diameter and the through-holes in each layer must be aligned precisely. This invention provides an alternative means of interconnection—namely electrical interconnection using dendrites. Dendrite interconnection avoids the need to drill or punch holes for vias or through-holes.

An object of this invention is to provide a means for connecting two conductors along the vertical or z-axis without using vias or through-holes, but still resulting in tight tolerances and high yield. Dendrite interconnections accomplish this purpose.

SUMMARY OF THE INVENTION

It is an object of this invention to provide an electronic circuit package with dendrites forming electrical connections between a first conductive layer and second conductive layer.

A further object of this invention is to provide an electronic circuit package that provides electrical connection in the z-axis using dendrites, thereby eliminating the need for drilling or punching through-holes or vias in the manufacturing process of the electronic circuit package.

A third object of this invention is to provide a method of fabrication of electronic circuit packages with dendrites forming electrical connections between a first conductive layer and a second conductive layer.

Accordingly, a method is provided for connecting two conductive layers in an electronic circuit package comprising the steps of forming dendrites on selected regions of a first conductive layer, forming dendrites on selected regions of a second conductive layer, applying an epoxy dielectric material over the first conductive layer, and compressively attaching the second conductive layer to the first conductive layer such that the dendrites on the first conductive layer contact the dendrites on the second conductive layer. Also claimed is an electronic circuit package incorporating the dendrites used for electrical interconnection manufactured in accordance with the present invention. An alternative embodiment of the invention utilizes an intermediate surface metal with dendrites in place of a "through via."

It is an advantage of the present invention that the dendrites provide electrical connection between two conductive layers of the electronic circuit package.

It is a further advantage that the dendrites provide electrical connection in the z-axis using dendrites, thereby eliminating the need for photodefining, laser ablating, drilling or punching through-holes or vias in the manufacturing process of the electronic circuit package.

Other features and advantages of the present invention will become apparent in the following detailed description of the preferred embodiment of the invention taken in conjunction with the accompanying drawings and examples.

DETAILED DESCRIPTION OF THE INVENTION

The present invention is of an electronic circuit package using dendrites to provide connection between two conductive surfaces, thereby avoiding the need to photodefine, laser ablate, drill or punch through-holes or vias. The invention can best be understood by reference to the drawings.

Figure 1:
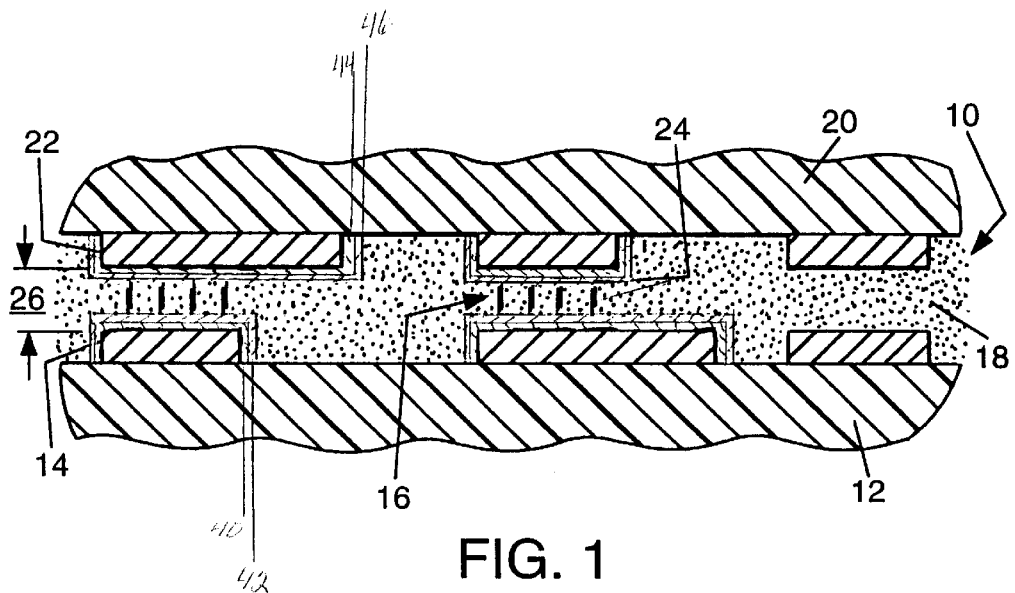
FIG. 1 is a depiction of a single layer of a multi-layer electronic circuit package using dendrites, rather than through-holes or vias, to electrically connect two conductive surfaces, in accordance with the present invention.

FIG. 1 illustrates a sample layer 10 of an electronic circuit package in accordance with the present invention. Referring to FIG. 1, at the bottom of the layer 10 is a first substrate 12. The first substrate 12 can be a printed circuit board core or a subcomposite. The first substrate 12 is preferably made of FR-4 type epoxy. A first surface metal 14 is situated on top of the first substrate 12 and covers some portion of the upper surface of first substrate 12. The first surface metal 14 forms a first conductive surface. In the preferred embodiment of the invention, the first surface metal 14 is made of a copper material.

Lower dendrites 16 are formed at selected locations on the first surface metal 14. The lower dendrites 16 preferably are made of palladium metal. Palladium metal possesses desired mechanical and physical properties. Other suitable metals for the lower dendrites include, but are not limited to, nickel or copper.

The lower dendrites may be formed by a variety of methods. One such method is to apply a photoresist material to the area of first surface metal 14 and then expose and develop the resist (not shown) by photolithographic techniques to provide an exposed area on which the dendrites are to be formed.

Typical photoresist materials are methacrylate polymeric resist compositions and electrohoretic resists such as those obtainable from Shipley or Nippon Paint.

According to a preferred method, an intermediate layer of nickel 40 is electroplated onto the first surface metal 14 followed by an intermediate layer of palladium 42, after applying resist material.

The nickel layer is typically about 1 to about 2.5 microns and more typically about 2 microns thick. The nickel covers the first surface metal 14 to prevent it from contaminating the palladium plating composition.

In addition this intermediate layer of palladium is typically about 1 to about 2.5 microns and more typically about 2 microns thick.

The lower dendrites 16 then are formed on the intermediate palladium layer by any known technique such as by ultrasonic plating of palladium typically at about 80 to 100 milliamps/cm$^2$ of surface area of first surface metal 14. It is preferred that the lower dendrites 16 are about 0.1 to 1.5 mil., preferably 1 mil. in height. If desired, each of the lower dendrites 16 can be coated with a metal that could interface with or diffuse to form a metallic bond. For instance, the lower dendrites 16 can be coated with pure gold or with tin.

The photoresist is then removed by stripping in a suitable solvent such as propylene carbonate.

Once the lower dendrites 16 are formed, a layer of epoxy dielectric 18 is applied across the upper surface of substrate 12. The dielectric 18 thus covers the substrate 12, the first surface metal 14 and the lower dendrites 16. The adhesive dielectric layer 18 typically is in the range of 1 mil. to 5 mil. in thickness. In the preferred embodiment of the invention, the epoxy based dielectric 18 is Morton LB 404. Other suitable adhesives include, but are not limited to, BT-resin, polyimide, Teflon, and polysiloxanes. The dielectric may be applied by vacuum lamination, screen coating, curtain coating, or roller coating. In the preferred embodiment of the invention, the adhesive is applied by vacuum lamination of a dry film.

The top of the layer 10 is a second substrate 20. The second substrate 20 in the preferred embodiment of the invention, is made of epoxy glass. A second surface metal 22 is situated on the lower surface of second substrate 20 and covers some portion of second substrate 20. A layer of nickel 44 is applied to the second surface metal. A layer of palladium 46 is applied over the layer of nickel and the upper dendrites are formed on the palladium layer. The second surface metal 22 forms a second conductive surface. In the preferred embodiment of the invention, the second surface metal 22 is made of a copper material.

The first substrate 12 and the second substrate 20 may be made of the same material, but are not required to be. The first surface metal 14 may be made of the same material as the second surface metal 22, but is not required to be.

Upper dendrites 24 are formed at selected locations on the second surface metal 22. The upper dendrites 24 typically are made in the same manner and have the same composition as the lower dendrites 16. However, this is not required. The upper dendrites preferably are formed to a height of 0.1 to 1.5 mil., preferably 1 mil. If desired, the upper dendrites 24 also can be coated with a metal, as described above.

The second substrate 20, having the second surface metal 22 and the upper dendrites 24, then is attached compressively to the first substrate 12 that has the dielectric layer 18. After compression, the separation 26 between the first surface metal 14 and the second surface metal 22 is about 0.2 to 2 mil. As a result of the compression, the upper dendrites 24 are in contact with the lower dendrites 16, thereby forming an electrical connection between the first surface metal 14 and the second surface metal 22.

The upper dendrites 24 penetrate the adhesive layer 18 without any need for pre-drilled holes. To facilitate the mating process of the upper dendrites 24 to the lower dendrites 16, the adhesive 18 may be heated to facilitate flow. The dielectric 18 will cure by heating after the mating is completed.

To achieve optimum electrical connection, the upper dendrites 24 should be positioned on the upper surface metal 22 to correspond with the position of the lower dendrites 16 on the lower surface metal 14. Registration tolerance is large. Overlap of 1 mil. is desirable as long as 1 mil. clearance to an adjacent conductor is maintained.

The advantages of the dendrites 16 and 24 shown in FIG. 1 are two-fold. First, the dendrites 16 and 24 provide an electrical connection between the first surface metal 14 and the second surface metal 22. Second, the electrical connection is achieved without the need to drill or punch and plate through-holes or vias thereby simplifying the manufacturing process.

Dendrites also can be used as electrical connectors when there are more than two layers involved. In an alternative embodiment of the invention, a circuitized core with dendrites formed in selected areas on it is deposited wherever a "through via" would exist in more traditional manufacturing. A "through via" is one that is intended to make contact with a conductor on the corresponding layer. The via in the core is used only to provide electrical connection for the dendrites for the through connection from surface metal on one substrate to surface metal on another substrate.

Figure 2:
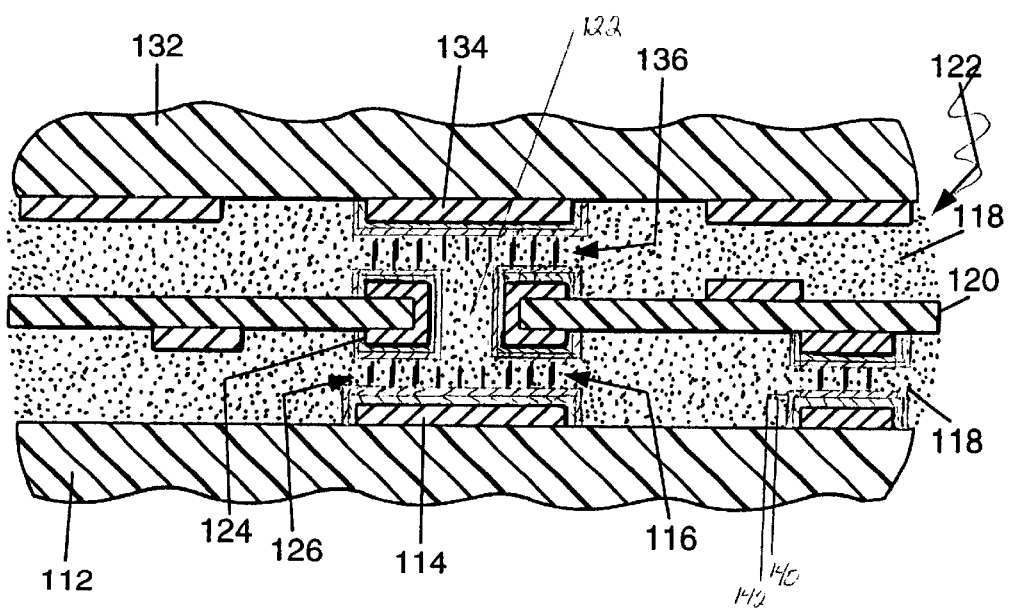
FIG. 2 is a depiction of two layers of a multi-layer electronic circuit package using dendrites to provide an electrical connection where a "through via" would exist in more traditional manufacturing.

FIG. 2 depicts the second embodiment of the invention. FIG. 2 shows a circuitized core 120 with a via 122. Surface metal such as 114, 124, and 134 is attached to certain areas of the circuit board core 120, the upper surface 132 and the lower surface 112. Dendrites 116, 126, and 136 are formed on selected areas of the surface metal 114, 124 and 134. A dielectric adhesive 118 holds the dendrites 116, 126, and 136 in position relative to each other. Dendrites in contact with each other thus form an electrical connection between the upper surface 132 and lower surface 112.

In more detail, the electronic circuit package shown in FIG. 2 comprises a first substrate, a first surface metal forming a first conductive surface on top of the first substrate and lower dendrites formed on selected areas of the first surface metal to a height of approximately 1 mil. A second substrate includes a second surface metal forming a second conductive surface on the lower surface of the second substrate and second-level dendrites formed on selected areas of the second surface metal to a height of approximately 1 mil. A third surface metal forms a third conductive surface on the upper surface of the second substrate. Third-level dendrites are formed on selected areas of the third surface metal to a height of approximately 1 mil. A third substrate includes a fourth surface metal forming a fourth conductive surface on the lower surface thereof. Upper dendrites are formed on selected areas of the fourth surface metal to a height of approximately 1 mil. A first layer of dielectric adhesive material is located between said first and second conductive surfaces. The lower dendrites and the second level dendrites penetrate said first layer of dielectric material and mate with each other, with said dielectric material of said first layer covering said lower level and said second level dendrites and holding said dendrites in place with support to one another. A second layer of dielectric adhesive material is located between the third conductive surface and the fourth conductive surface. The third level dendrites and the upper level dendrites penetrate said second layer of dielectric material and mate with each other, with the dielectric material of the second layer covering the upper level and the third level of dendrites and holding said dendrites in place with support to one another. Preferably, the first, second, third and fourth surface metals each are covered with a layer of nickel 140. Each layer of nickel is covered with a layer of palladium 142. The dendrites 116, 126, 136 are then formed on each palladium layer 142 by ultrasonic plating of palladium.

The entire process described with respect to the two embodiments can be repeated to create more layers interconnected by dendrites as described above.

Figure 3:
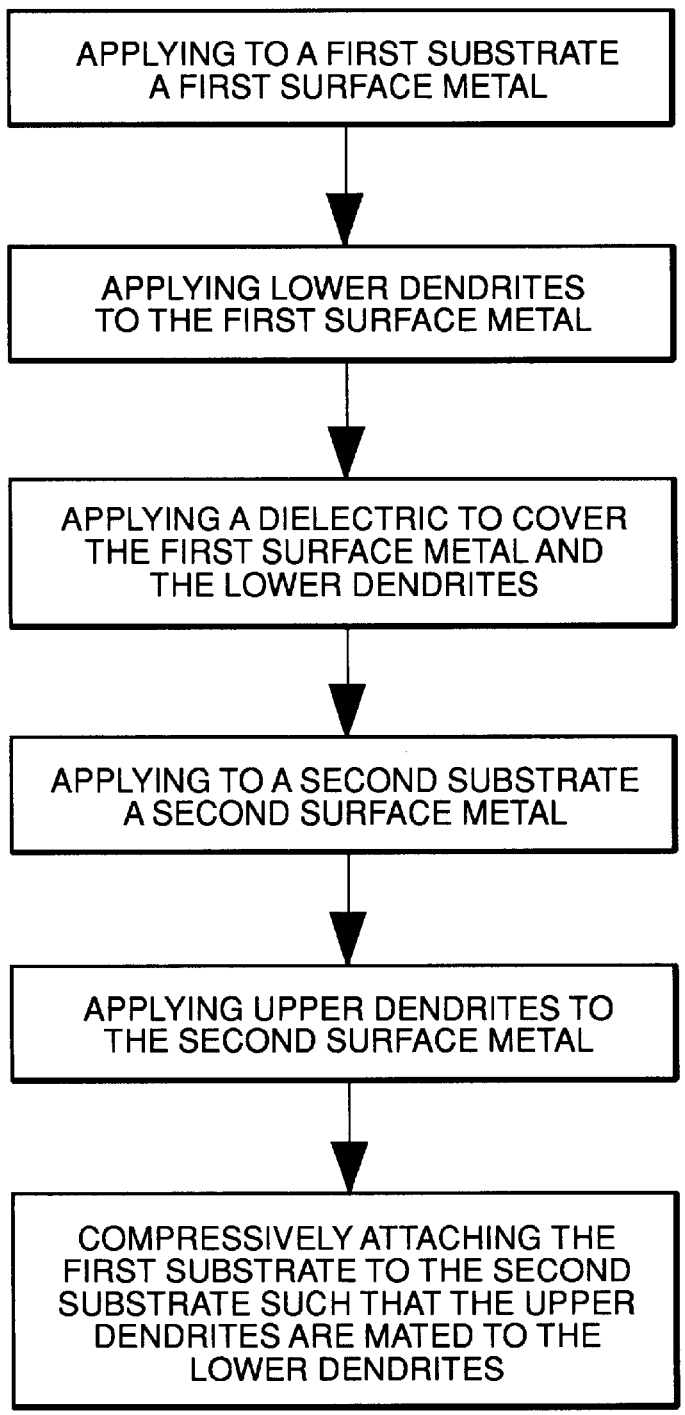
FIG. 3 is a flow chart of the method of the present invention.

FIG. 3 is a flow chart in accordance with the method of the present invention.

Although specific embodiments have been described herein for purposes of illustration, various modifications may be made without departing from the spirit or scope of the invention.

What is claimed is:

1. A multi-layer electronic circuit package, characterized by the replacement of vias and through holes by dendrites as electrical connections between layers, said circuit package comprising:
    a first substrate;
    a first surface metal forming a first conductive surface on top of the first substrate;
    a first intermediate layer of nickel and palladium on the first surface metal, the nickel having a thickness between about 1 and about 2.5 microns overlying selected areas of the first surface metal and the palladium having a thickness of between about 1 and about 2.5 microns overlying the nickel,
    lower dendrites made of palladium material and formed on the first intermediate layer to a height of approximately 1 mil;
    a second substrate;
    a second surface metal forming a second conductive surface on the lower surface of the second substrate;
    a second intermediate layer of nickel and palladium overlying selected areas of the second surface metal, the nickel having a thickness between about 1 and about 2.5 microns and the palladium having a thickness of between about 1 and about 2.5 microns overlying the nickel,
    upper dendrites made of palladium material and formed on the second intermediate layer to a height of approximately 1 mil;
    a layer of dielectric adhesive material between said first and second conductive surfaces; and
    said upper and lower dendrites penetrating said dielectric adhesive material and mating with each other, with said dielectric material covering said upper and lower dendrites and holding said dendrites in place with respect to one another.

2. The electronic circuit package of claim 1, wherein the first substrate is glass reinforced epoxy.

3. The electronic circuit package of claim 1, wherein the first surface metal is made of a copper material.

4. The electronic circuit package of claim 1, wherein the second substrate is glass reinforced epoxy.

5. The electronic circuit package of claim 1, wherein the second surface metal is made of a copper material.

6. The electronic circuit package of claim 1 wherein the adhesive is an epoxy based dielectric.

7. The electronic circuit package of claim 1 wherein the adhesive is selected from a group comprising BT-resin, polyimide, Teflon, and polysiloxanes.

8. A multi-layer electronic circuit package characterized by the replacement of vias and through holes by dendrites as electrical connections between layers, said package comprising:
    a first substrate;
    a first surface metal forming a first conductive surface on top of the first substrate; a first intermediate layer of nickel and palladium on the first surface metal,
    lower dendrites formed on selected areas of the first intermediate layer to a height of approximately 1 mil;
    a second substrate;
    a second surface metal forming a second conductive surface on the lower surface of the second substrate; a second intermediate layer of nickel and palladium on the second surface metal,
    second-level dendrites formed on selected areas of the second intermediate layer to a height of approximately 1 mil;
    a third surface metal forming a third conductive surface on the upper surface of the second substrate; a third intermediate layer of nickel and palladium on the third surface metal,
    third-level dendrites formed on selected areas of the third intermediate layer to a height of approximately 1 mil;
    a third substrate;
    a fourth surface metal forming a fourth conductive surface on the lower surface of the third substrate; a fourth intermediate layer of nickel and palladium on the fourth surface metal,
    upper dendrites formed on selected areas of the fourth intermediate layer to a height of approximately 1 mil;
    a first layer of dielectric adhesive material between said first and second conductive surfaces, said lower dendrites and said second level dendrites penetrating said first layer of dielectric material and mating with each other with said dielectric material of said first layer covering said lower level and said second level dendrites and holding said dendrites in place with support to one another; and
    a second layer of dielectric adhesive material between said third conductive surface and said fourth conductive surface, said third level dendrites and said upper level dendrites penetrating said second layer of dielectric material and mating with each other with said dielectric material of said second layer covering said upper level and said third level of dendrites and holding said dendrites in place with support to one another.

9. The electronic circuit package of claim 8, wherein the first substrate is glass reinforced epoxy.

10. The electronic circuit package of claim 8, wherein at least one surface metal is comprised of a copper material.

11. The electronic circuit package of claim 8, wherein the dendrites are comprised of palladium material.

12. The electronic circuit package of claim 8 wherein the adhesive is an epoxy based dielectric.

13. The electronic circuit package of claim 8 wherein the adhesive is selected from a group comprising BT-resin, polimide, Teflon, and polysiloxanes.

* * * * *

UNITED STATES PATENT AND TRADEMARK OFFICE
CERTIFICATE OF CORRECTION

PATENT NO.    : 6,300,575 B1
DATED         : October 9, 2001
INVENTOR(S)   : Bernrd K. Appelt, Saswati Datta, Michael A. Gaynes, John M. Lauffer and James R. Wilcox It is certified that error appears in the above-identified patent and that said Letters Patent is hereby corrected as shown below:

<u>Column 8,</u>
Line 3, after "the" second occurrence, insert -- dielectric --.
Line 5, after "the" second occurrence, insert -- dielectric --;
Line 7, change "polimide" to -- polyimide --

Signed and Sealed this

Thirtieth Day of April, 2002

Attest:

Attesting Officer

JAMES E. ROGAN
*Director of the United States Patent and Trademark Office*